United States Patent [19]

Ogimura et al.

[11] Patent Number: 5,381,038
[45] Date of Patent: Jan. 10, 1995

[54] SEMICONDUCTOR DEVICE HAVING PASSIVATION PROTRUSIONS DEFINING ELECTRICAL BONDING AREA

[75] Inventors: Yoshitomo Ogimura; Kenzi Motai, both of Kawasaki, Japan

[73] Assignee: Fuji Electric Co., Ltd., Kanagawa, Japan

[21] Appl. No.: 47,612

[22] Filed: Apr. 8, 1993

Related U.S. Application Data

[63] Continuation of Ser. No. 808,807, Dec. 18, 1991, abandoned.

[30] Foreign Application Priority Data

Dec. 19, 1990 [JP]  Japan .................. 2-403395
Aug. 5, 1991 [JP]  Japan .................. 3-194600

[51] Int. Cl.6 ............ H01L 23/48; H01L 29/44; H01L 29/52; H01L 29/60
[52] U.S. Cl. .................. 257/689; 257/688; 257/690; 257/734
[58] Field of Search .......... 357/71, 79, 67, 68; 257/688, 689, 690, 734, 758, 759, 760, 787, 788, 789

[56] References Cited

U.S. PATENT DOCUMENTS

4,646,130  2/1987  Creutz .................. 357/79
4,918,514  4/1990  Matsuda et al. ........ 357/79

FOREIGN PATENT DOCUMENTS

0008975   1/1979  Japan .................. 257/688
929836    2/1959  United Kingdom .
957316    2/1961  United Kingdom .
965289    9/1961  United Kingdom .
1062006   6/1965  United Kingdom .
WO82/02798 8/1982 WIPO .

*Primary Examiner*—Andrew J. James
*Assistant Examiner*—Carl Whitehead, Jr.
*Attorney, Agent, or Firm*—Finnegan, Henderson, Farabow, Garrett & Dunner

[57] ABSTRACT

An electrode construction intended to facilitate soldering with a semiconductor disc element having a pair of electrode plates soldered to a semiconductor chip with the semiconductor chip held between the electrode plates. A stepped protrusion is disposed on the central part of each electrode plate such that the stepped protrusion is directed into a solder joint of the semiconductor chip. While the stepped protrusion is held in the solder joint of the semiconductor chip, the electrode plate floats above a passivation on the semiconductor chip side before being soldered to the semiconductor chip. The electrode plates have orientation slits and orientation flats as references for positioning purposes. The electrode plates, semiconductor chip, and stepped protrusions are protected by a uniform layer of shrinkage tube.

20 Claims, 8 Drawing Sheets

SEMICONDUCTOR DEVICE HAVING PASSIVATION PROTRUSIONS DEFINING ELECTRICAL BONDING AREA

This application is a continuation of application Ser. No. 07/808,807 filed Dec. 18, 1991, now abandoned.

BACKGROUND OF THE INVENTION

1. Field of the Invention

The present invention relates to the electrode construction of a semiconductor disc element, and more particularly, to the electrode construction of a disc semiconductor element having a semiconductor chip held between electrode plates which are greater in diameter than the semiconductor chip and are joined to the respective sides of the semiconductor chip with solder.

2. Discussion of the Related Art

A conventional electrode construction of the above semiconductor disc element will be described with reference to FIGS. 20 to 23 using a Silicon Surge Absorber as an example. As shown in FIGS. 20 to 23, the semiconductor element comprises a square semiconductor chip 1, disc electrode plates 2 used to hold the semiconductor chip 1 therebetween and joined to the respective sides thereof with solder, solder layers 3, and passivation (silicon oxide layer) 5 approximately several micrometers thick and formed on respective sides of the semiconductor chip 1 along a junction 4 where p-type and n-type regions contact.

Each flat electrode plate 2 is soldered to the semiconductor chip 1 with the area inside the passivation 5 defining a solder joint 6. When the semiconductor chip 1 is soldered to the electrode plates 2, a jig is used to keep the temporary assembly intact by inserting a solder sheet between the semiconductor chip 1 and each of the electrode plates 2 and then passing the lamination through a heating oven to effect soldering.

The conventional electrode construction of a semiconductor disc element employing the above-described flat electrode plates joined onto both sides of a semiconductor chip has the following shortcomings.

(1) Because the passivation 5 of the semiconductor chip 1 hinders the electrode plate 2, the electrode plate 2 is kept slightly afloat from the solder joint of the semiconductor chip. If the amount of solder is insufficient, the solder joint therebetween, that is, the ohmic contact, will become incomplete. Consequently, the semiconductor element does not perform its characteristic functions during its operation. Moreover, if external pressure is applied via the electrode plate 2 to the semiconductor chip 1, the passivation may be cracked and damaged because the welding force is directly applied via the electrode plate 2 to the passivation 5.

(2) As molten solder tends to spread over the entire area of the electrode plates 2 due to wetness of the electrode plates during soldering, the surface tension of the solder acting thereon will allow the semiconductor chip 1 to shift randomly from the central position of the electrode plates 2. In some cases, the semiconductor chip 1 may be soldered such that the edge portion thereof is forced outside the outer peripheral edge of the electrode plates 2 as shown by a dotted line in FIGS. 22 and 23. Moreover, the semiconductor element soldered in such a manner may be damaged if the chip portion protruding beyond the electrode plate is bumped while the semiconductor chip 1 is being handled. Such semiconductor chips would be inferior and undesirable.

(3) Because the space between each of the electrode plates 2, disposed above and below the semiconductor chip 1, and the semiconductor chip are secured to about the extent of an insulating distance equivalent to the thickness of the semiconductor chip, an electric discharge may occur between the electrode plates when the surge voltage is applied, irrespective of the characteristics of the semiconductor chip 1. As a result, the semiconductor chip 1 (surge absorber) may not be able to perform the surge absorbing function adequately.

(4) Conventionally, liquefied silicone rubber has been applied to the peripheral sides of the semiconductor chip 1 and hardened to protect the semiconductor chip 1 from external forces. This is, however, extremely difficult and impractical. Unless meticulous care is taken when applying the liquefied silicone rubber, the silicone rubber may be applied inadvertently to an undesired portion such as the surface of the electrode plate, in which case the thickness of the layer of the semiconductor chip 1 may become thin.

SUMMARY OF THE INVENTION

The present invention has been made in view of the above circumstances and has as an object to provide an electrode construction of a semiconductor element intended for a disc semiconductor element, such as a silicon surge absorber, designed to increase the percentage of non-defective units by improving the soldering of the semiconductor chip and electrode plates.

An additional object is to provide a sufficient insulating distance between the electrode plates.

A further object of the present invention is to provide a semiconductor element with protective layers disposed at the peripheral areas of a chip relative to the semiconductor element assembly.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the electrode construction of a semiconductor disc element of the present invention comprises a first electrode plate and a second electrode plate, each of the electrode plates having a base and a first stepped protrusion, a semiconductor chip having a solder joint and positioned between the electrode plates, each of the electrode plates being joined onto respective sides of the semiconductor chip with solder. Each of the first stepped protrusion is in contact with the solder joint of the semiconductor chip and each of the first stepped protrusion is positioned in a central portion of the base of each of the electrode plates. The stepped protrusion may have a tapered peripheral face toward one end.

The electrode construction further comprises a second stepped part protruding from each of the bases of the electrode plates in such a way as to surround the first stepped protrusion, the second stepped part being smaller in height than the first stepped protrusion and smaller in diameter than the diagonal dimension of the semiconductor chip.

The electrode construction further comprises a notch or a dam for holding molten solder formed on the peripheral face of the second stepped part.

The electrode construction further comprises means for positioning said first and second electrode plates and a protective layer to protect the semiconductor element from the external environment.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
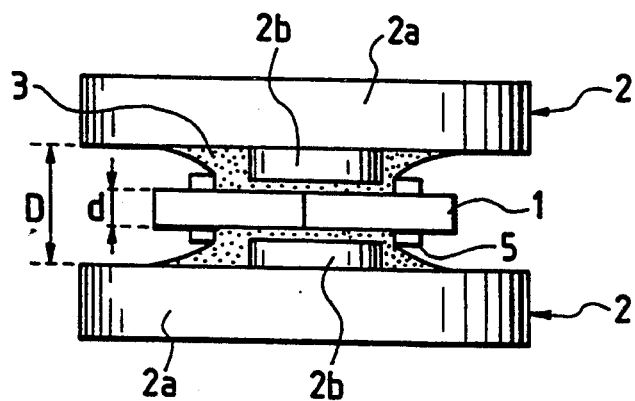
FIG. 1 is a diagram illustrating an assembled semiconductor element according to a first embodiment of the present invention.

The electrode construction of the present invention includes stepped protrusions directed to solder joints of a semiconductor chip and formed on central parts of bases of the respective electrode plates. The diameter of the edge face of the stepped protrusions in the electrode construction is smaller than that of the solder joint of the semiconductor chip. The edge face of the stepped protrusions may also be a square having the length of a side smaller than that of the solder joint.

Moreover, a second stepped part may protrude from each base of the electrode plates in such a way as to surround the stepped protrusion in the electrode construction described above. The second stepped part is smaller in height than the stepped protrusion and smaller in diameter than the diagonal dimension of the semiconductor chip in order to further facilitate soldering between the semiconductor chip and the electrode plates.

In addition, a notch or a dam for holding molten solder may be formed on the peripheral face of the second stepped part in the construction described above.

Further, the stepped protrusion thus constructed may have a tapered peripheral face toward one end in the construction described above to disperse the welding force externally applied via the electrode plate and to alleviate the force directly affecting the semiconductor chip.

With respect to an electrode plate whose exterior of the peripheral face of the stepped part is square, there may be formed orientation slits in the side opposite to the stepped part of the electrode plate or an orientation flat in a part of the peripheral edge of the electrode plate as an auxiliary means of precisely setting the directions of the electrode plate and the semiconductor chip during the process of assembling the semiconductor element.

In order to accomplish the second object, an electrically insulating heat shrinkage tube is fastened to the outer periphery of the element assembly so as to surround the semiconductor chip in the semiconductor element according to the present invention.

As the electrode plates used are joined to the semiconductor chip with solder, the edge face of the stepped protrusion formed on the central part of each base of the electrode plates contacts the solder joint of the semiconductor chip. Consequently, the stepped protrusion functions as a spacer, and the base of each electrode plate is joined to the semiconductor chip such that the passivation on the semiconductor chip side remains more afloat. Thus, the electrode plate cannot hit and damage the passivation on the semiconductor chip side. Moreover, unnecessary electric discharge between the electrode plates may be prevented as an insulating distance greater than the thickness of the semiconductor chip is ensured between the electrode plates facing each other with the semiconductor chip therebetween.

In the construction of the second stepped part formed on the electrode plate, in addition to the step portion, there is a difference in the level between the electrode plate and the second stepped part, whereby the expansion of the molten solder is limited to the second step side at the time of soldering. Therefore, the semiconductor chip is affected by the surface tension of the molten solder to the extent that the solder is held and stays within the area of the second stepped part on the electrode plate. Moreover, as the outer diameter of the second stepped part is chosen to be smaller than the diagonal dimension of the semiconductor chip, the semiconductor chip is consequently secured in the central position of the electrode plate and retained within the outer periphery of the base of the electrode plate.

In the construction of the notch or the dam formed on the peripheral face of the second stepped part, solder is prevented from flowing out of the second stepped part because the notch or the dam prevents the molten solder from flowing out.

Further, with the tapered peripheral face toward one end of the step portion, the welding force externally applied to the electrode plate is divided into components on the tapered face. The vertical component presses the semiconductor chip on the tapered face and the horizontal component presses the solder layer peripherally and perpendicularly thereto. Therefore, the stress concentration on the semiconductor chip is alleviated to prevent the chip from being damaged.

Orientation slits and/or an orientation flat formed on each of the electrode plates with the square stepped protrusion act as a reference during the process of positioning the semiconductor chip and electrode plates for soldering. For example, the orientation slits and/or orientation flat of the electrode plates allow the parallel arrangement of the semiconductor chip and the side of the stepped protrusion relative to the assembling jig.

In addition, a heat shrinkage tube fastened to the periphery of the semiconductor chip in the semiconductor element assembly protects the semiconductor chip from external forces after the handling stage. Moreover, the adoption of the heat shrinkage tube allows the protective layers to have a uniform thickness in tight contact with the periphery of the chip. The heat shrinkage tube is much more convenient and practical than the liquefied silicone rubber.

Figure 22:
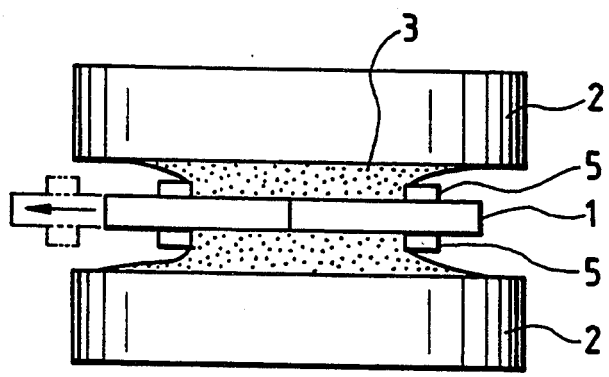
FIG. 22 is a diagram illustrating an assembled semiconductor element using conventional electrode plates.
Figure 23:
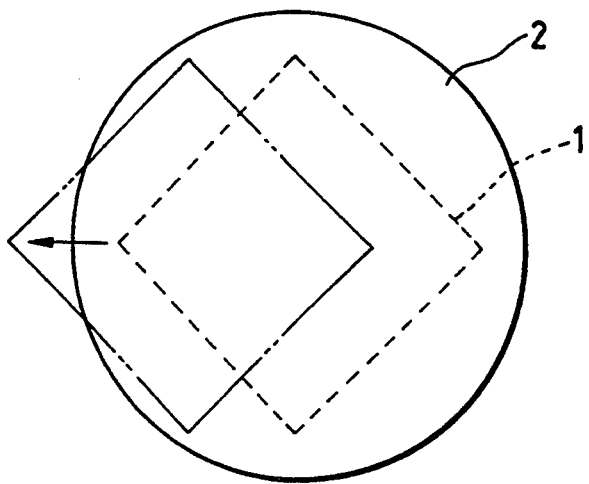
FIG. 23 is a top view of FIG. 22.

The preferred embodiments of the present invention will be described with reference to the accompanying drawings, wherein like reference characters designate like and corresponding parts of FIGS. 22 and 23.

Figure 2:
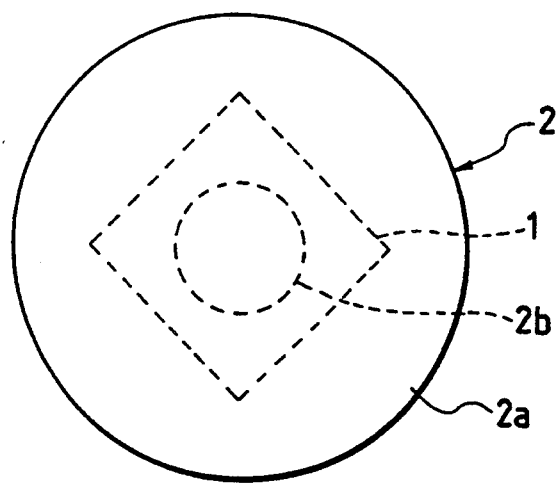
FIG. 2 is a top view of FIG. 1.
Figure 3:
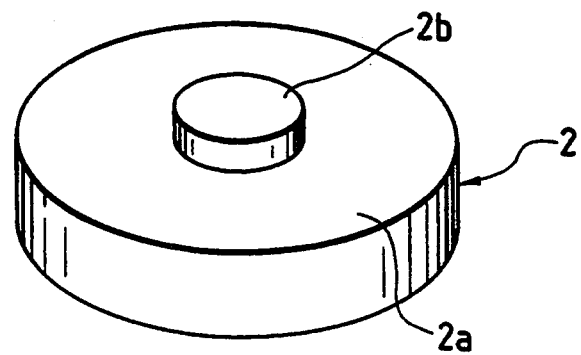
FIG. 3 is an external perspective view of the electrode plate in FIG. 1.

FIGS. 1 to 3 illustrate a first embodiment of the present invention. The embodiment includes a semiconductor chip 1 held between disc electrode plates 2 soldered to both sides thereof, a stepped protrusion 2b formed on a central portion of each electrode base 2a which projects therefrom toward the semiconductor chip 1. A passivation 5 defines a solder joint 6. The edge face diameter of the stepped protrusion 2b is set small enough to fit in the passivation 5 of the semiconductor chip 1, and the edge face height thereof is set greater than the thickness of the passivation 5.

Figure 4:
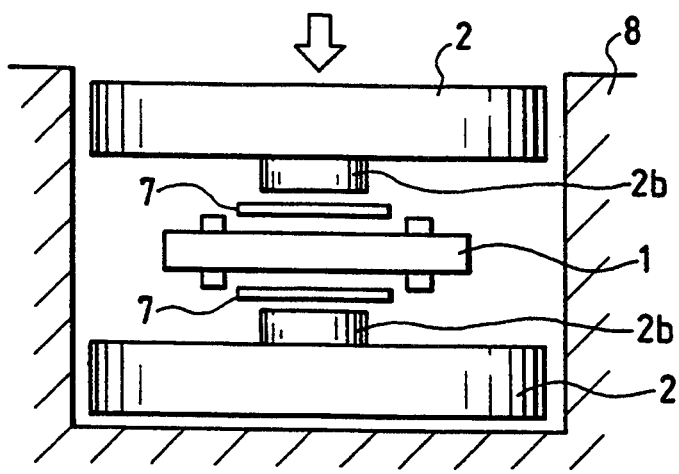
FIG. 4 is a diagram illustrating the semiconductor chip and the electrode plate joined together with solder.

In order to solder the electrode plates 2 to both sides of the semiconductor chip 1, respectively, the semiconductor chip 1, the electrode plates 2, and solder sheets 7 are stacked up as shown in FIG. 4. This combination is placed in a hole (the diameter of the hole being greater than the outer diameter of the electrode plate by about 0.1–0.2 mm) made in a soldering jig 8 formed of carbon. Subsequently, the jig 8 is passed through a heating oven to effect soldering.

With the electrode plates 2 thus employed in the construction described above, the stepped protrusion 2b of each of the electrode plate 2 contacts the solder joint of the semiconductor chip 1 and functions as a spacer as shown in FIG. 1. Thus, the electrode base 2a is soldered to the semiconductor chip 1 in a floating state without contacting the passivation 5. Therefore, the electrode plates 2 cannot damage the passivation 5 by directly pressing the film. Even after the electrode plates are soldered to the semiconductor chip, it is possible to secure an insulating distance D greater than the thickness dimension d of the semiconductor chip 1 between the peripheral edge of bases 2a of the electrode plates 2 vertically facing each other. In addition, even if the semiconductor chip 1 shifts toward the outer periphery of the electrode 2 due to surface tension of the molten solder at the time of soldering, the stepped protrusion 2b will not be displaced very far since the stepped protrusion 2b will be caught by the passivation 5 on the semiconductor chip side. Therefore, the semiconductor chip 1 may be placed substantially at the center of the base 2a.

Figure 7:
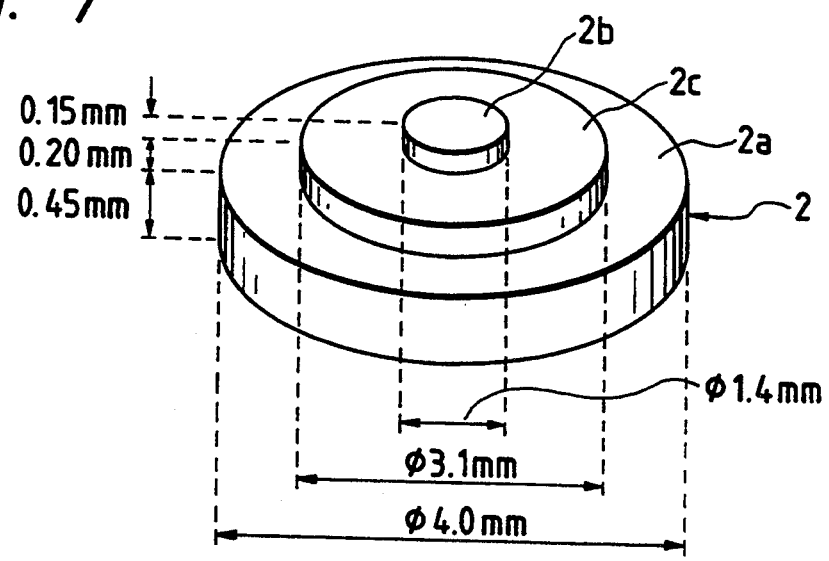
FIG. 7 is an external perspective view of the electrode plate in FIG. 6.
Figure 8:
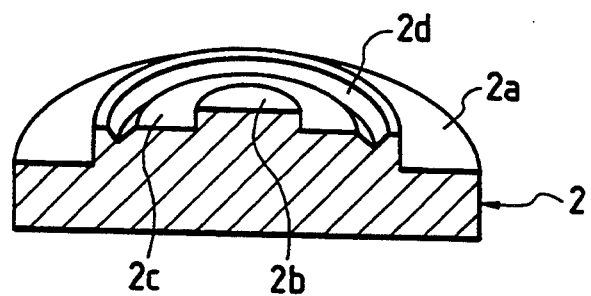
FIG. 8 is a perspective sectional view of an electrode plate with a notch.
Figure 9:
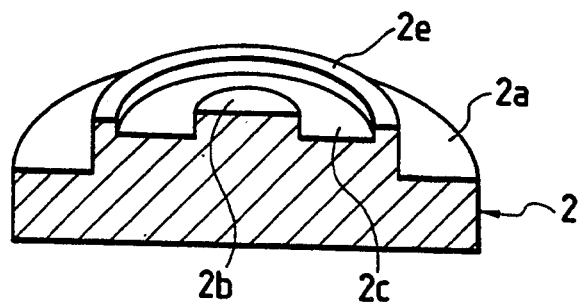
FIG. 9 is a perspective sectional view of an electrode plate with a dam.

FIGS. 5 to 9 illustrate a second embodiment of the present invention. In this embodiment, second stepped parts 2c are formed, in addition to the stepped protrusions 2b, on the respective electrode bases 2a. The second stepped parts 2c are lower than the stepped protrusions 2b and smaller in outer diameter than the diagonal dimension of the semiconductor chip 1. For example, the specific numerical values of the respective dimensions may be as follows: a side of the square semiconductor chip 1 is 2.6 mm long (the diagonal dimension being 3.67 mm); and the electrode plates 2 have dimensions as shown in FIG. 7. Moreover, with respect to the second stepped part 2c, a V-shaped notch 2d may be formed as shown in FIG. 8 or a dam 2e may be formed as shown in FIG. 9 along the outer peripheral face thereof to prevent the molten solder from flowing out from the step face area of the second stepped part 2c to the outer peripheral side at the time of soldering.

Figure 5:
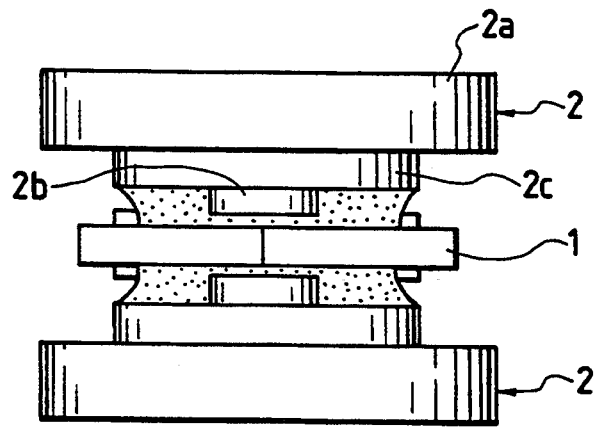
FIG. 5 is a diagram illustrating an assembled semiconductor element according to a second embodiment of the present invention.
Figure 6:
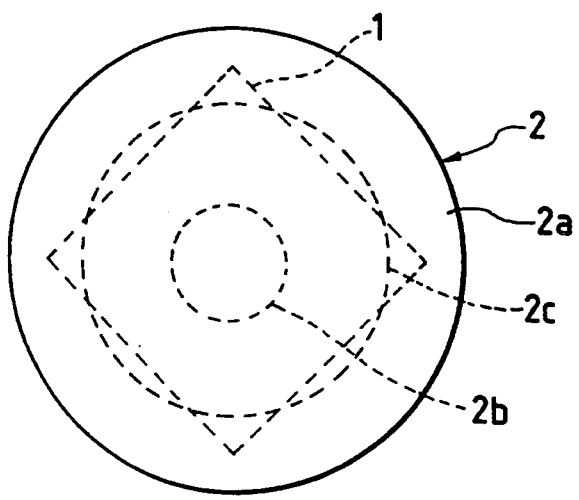
FIG. 6 is a top view of FIG. 5.

With the construction described above, the molten solder is prevented from flowing out beyond the second stepped part 2c toward the outer peripheral side at the time of soldering, whereby the semiconductor chip 1 is drawn to the center of the base 2a due to the surface tension of the molten solder and joined thereto with solder. The semiconductor chip 1 is prevented from moving outside the outer periphery of the electrode plates 2 as described above with reference to FIGS. 22 and 23. Moreover, the second stepped part 2c is properly located in the central position of each of the electrode plates 2 before being Joined thereto without directly contacting the passivation 5 of the semiconductor chip 1 as shown in FIG. 5.

Figure 10:
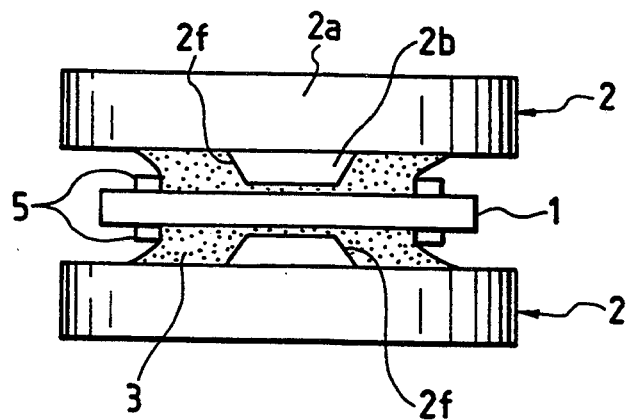
FIG. 10 is a diagram illustrating an assembled semiconductor element according to a third embodiment of the present invention.

FIG. 10 illustrates a third embodiment of the present invention. In this embodiment, the stepped protrusion 2b on the central portion of the base 2a of the electrode plate 2 has a peripheral face 2f tapered toward one end.

With the peripheral face 2f tapered toward one end of the stepped protrusion 2b, the welding force externally applied to the electrode plate 2 is divided into a vertical component of the force which vertically presses the semiconductor chip 1 and a horizontal component for pressing the solder layer 3 perpendicularly toward the outer periphery when the semiconductor device, while in operation, is held under pressure. As a result, the welding force directly acting on the semiconductor chip 1 is alleviated to prevent damage of the semiconductor chip.

Figure 11:
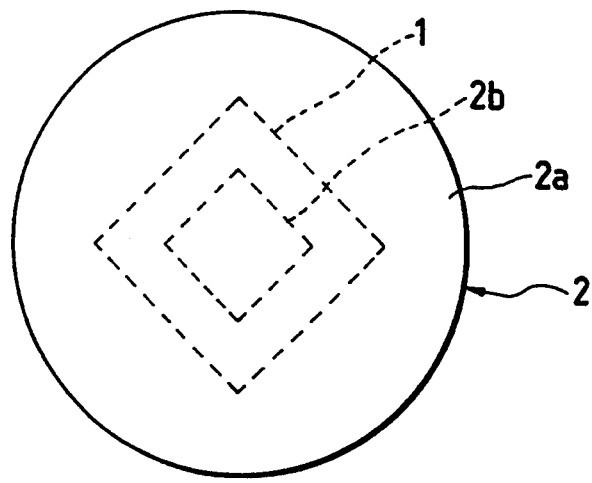
FIG. 11 is a top view illustrating an assembled semiconductor element according to a fourth embodiment of the present invention.
Figure 12:
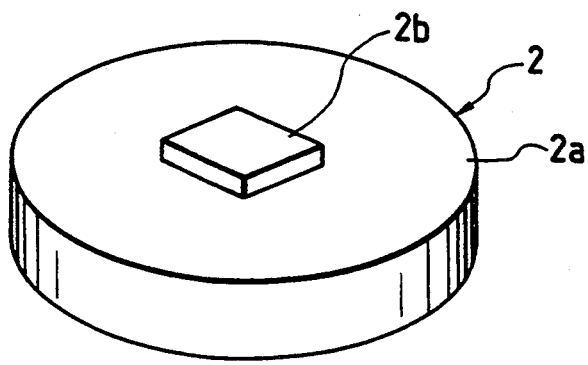
FIG. 12 is an external perspective view of an electrode plate of the embodiment of FIG. 11 with a stepped protrusion.
Figure 13:
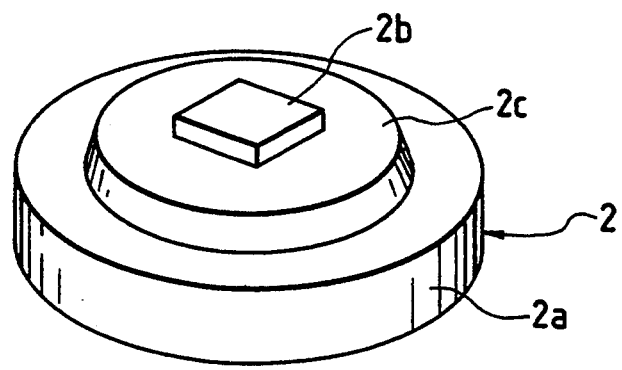
FIG. 13 is an external perspective view of an electrode plate of the embodiment of FIG. 12 with a second stepped part.
Figure 21:
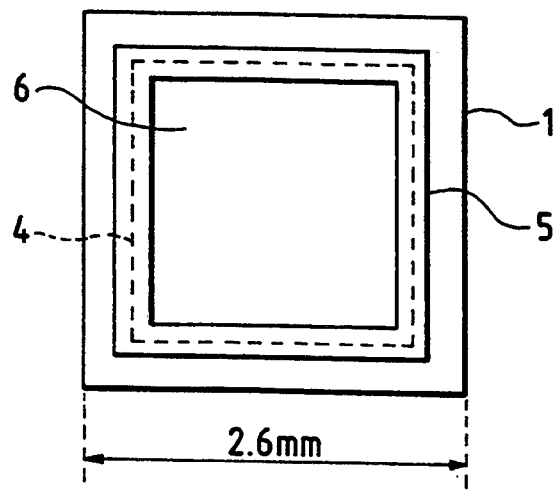
FIG. 21 is a top view of FIG. 20.

FIGS. 11 to 15 illustrate a fourth embodiment of the present invention. In this embodiment, unlike the preceding embodiments which have circular stepped protrusions 2b formed on the electrode plates, the exterior periphery of the stepped protrusion 2b and the semiconductor chip 1 have square shapes. The length of an edge face on one side of the stepped protrusion 2b shown in FIGS. 11 and 12 is smaller than that of the solder joint 6 (see FIG. 21) of the semiconductor chip 1. In other words, the diagonal dimension of the stepped protrusion 2b is smaller than the diagonal dimension of the solder joint 6. The stepped protrusion is similar to what is shown in the embodiment of FIG. 13 described above in that it is of dual construction and the external dimension of the second stepped part 2c is smaller than the diagonal dimension of the semiconductor chip. A notch or a dam may be formed in the embodiment of FIG. 13, similar to FIGS. 8 and 9, respectively, of the second embodiment, along the outer peripheral face of the second stepped part 2c to prevent molten solder from flowing out. Further, the peripheral side of the stepped protrusion 2b may be tapered toward one end as shown in FIG. 10 of the third embodiment.

Figure 14:
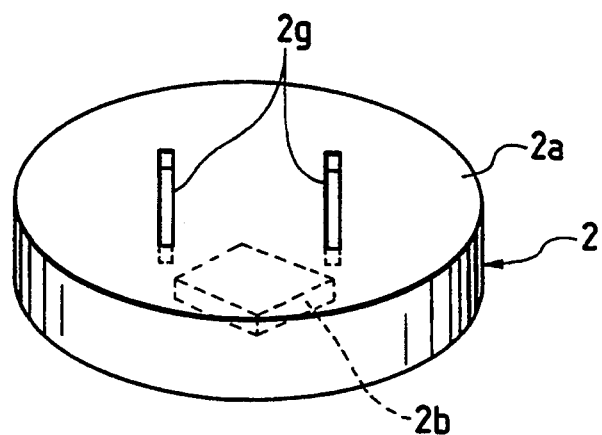
FIG. 14 is an external perspective view of an electrode plate with orientation slits.
Figure 15:
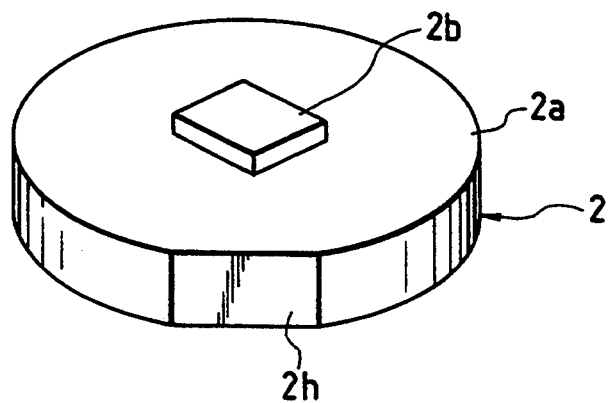
FIG. 15 is an external perspective view of an electrode plate with an orientation flat.
Figure 16:
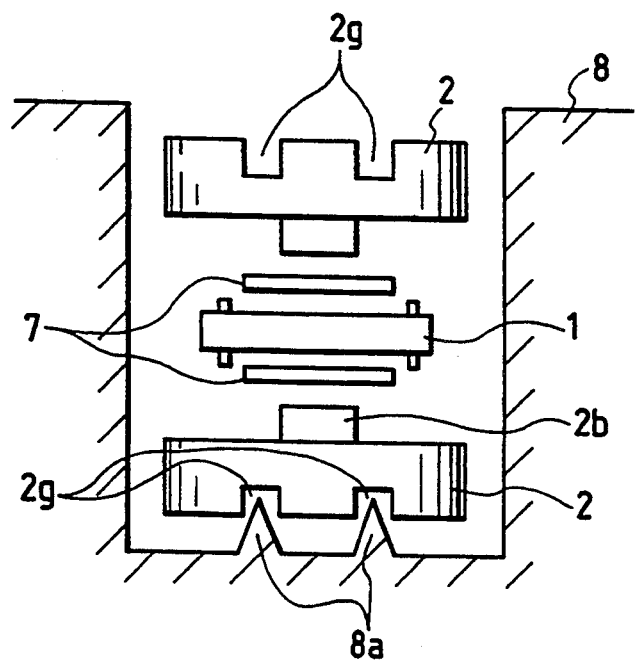
FIG. 16 is a diagram showing an assembling jig during an assembly of a semiconductor element employing the electrode plate of FIG. 14.

As shown in FIG. 14, orientation slits 2g are bored in the electrode plate 2 at the side opposite to the stepped protrusion for the purpose of positioning. In addition, an orientation flat 2h may be formed on a part of the peripheral edge of the electrode plate 2. During the process of assembling the semiconductor element, projections 8a located at the bottom of the cavity of an assembly jig 8 (FIG. 16) are inserted into the orientation slits 2g of the electrode plate 2 to hold the electrode plate 2 in position. If the relative positions between the side of the square stepped protrusion 2b and the direction of the orientation slits 2g on the electrode plate are predetermined, each of the stepped protrusions 2b of the electrode plates 2 and the semiconductor chip 1 can be soldered together correctly in a stacked position by setting them in parallel to each other in the assembly jig 8 with the orientation slits 2g as a reference. Although two of the parallel grooves have been introduced as the orientation slits 2g in FIG. 14, the slits are not restricted to this arrangement. For instance, the slits may be cross-shaped grooves.

Figure 17:
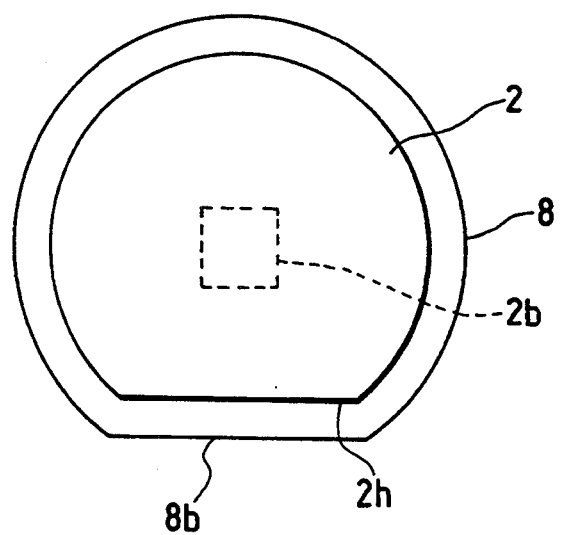
FIG. 17 is a top view of an assembling jig during assembly of a semiconductor element employing the electrode plate of FIG. 15.

As shown in FIG. 17, an orientation flat 8b may also be formed on the side of the assembly jig 8. The direction of the orientation flat 2h of each electrode plate 2 is adjusted to the orientation flat 8b of the assembly jig 8 to hold the electrode plate in position during the process of assembling the semiconductor element. Hence, positioning of the semiconductor chip and the electrode plates is easily implemented in the assembly jig 8 with the orientation flat as a reference.

Figure 18:
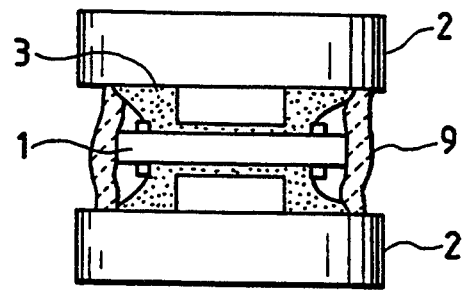
FIG. 18 is a diagram illustrating an assembled semiconductor element according to a fifth embodiment of the present invention.
Figure 19:
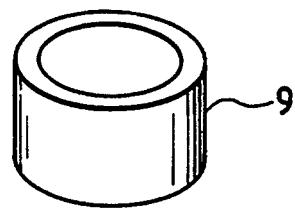
FIG. 19 is an external drawing of the heat shrinkage tube of the embodiment of FIG. 18.
Figure 20:
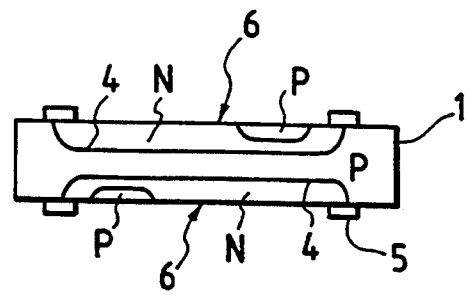
FIG. 20 is a side view of a semiconductor chip incorporated in a semiconductor element according to the present invention.

FIGS. 18 and 19 illustrate a fifth embodiment of the present invention. In this embodiment, an electrically insulating heat shrinkage tube 9, which may be made of plastic, is used to cover the assembly of the semiconductor element shown in FIG. 1 to surround the semiconductor chip 1. The semiconductor element is thus protected from external forces. The heat shrinkage tube 9 preferably has a wall thickness ranging from approximately several millimeters to several tens of millimeters.

The semiconductor chip 1 is covered with the heat shrinkage tube 9 after the semiconductor chip 1 and the electrode plates 2 are joined with solder and heated, as shown in FIG. 19. The heat shrinkage tube 9 is then caused to shrink and adheres to the peripheral face of the semiconductor chip 1, so that a protective layer, uniform in thickness, is formed on the peripheral area.

Implementation of a heat shrinkage tube as described above allows for a simpler and more feasible form of protective layer compared with the conventional process of applying and hardening liquefied silicone rubber to the peripheral face of the semiconductor chip. In addition, problems resulting from the liquefied silicone rubber adhering to undesired parts is prevented.

Although a description has been given of the electrode plate 2 of a disc shape in the embodiments, the electrode plate applicable to the present invention is not limited to the disc shape, but may be of a different shape such as a square, for instance, analogous to the shape of the semiconductor chip. Moreover, the tapered face described in the third embodiment may be applied to the peripheral face of the second stepped part described in the second embodiment.

The electrodes of the semiconductor element constructed according to the present invention, have the following advantageous effects:

(1) Because the stepped protrusion is formed on the central portion of the base of the electrode plate, the stepped protrusion functions as a spacer and the semiconductor chip is soldered to the electrode plate such that the electrode plate floats above the passivation on the side of the semiconductor chip, which prevents damage to the passivation attributable to its direct contact with the electrode plate.

(2) Moreover, because an insulating distance greater than the thickness of the semiconductor chip is secured between the electrode plates facing each other with the semiconductor chip therebetween, undesired electric discharge is prevented from occurring between the electrode plates while the semiconductor element is being operated.

(3) In the electrode construction with the stepped protrusions and the second stepped parts formed on the bases of the respective electrode plates, the semiconductor chip is drawn to the central position of each electrode plate due to the surface tension of the molten solder. Therefore, it is possible to prevent the case in which the semiconductor chip is outwardly shifted and forced outside the peripheral edges of the electrode plates, such as may occur if conventional flat electrode plates are used. The percentage of non-defective units is thus improved.

(4) Further, in the electrode construction with the notch or the dam for holding solder on the peripheral edge face of the second stepped part, the molten solder is prevented from flowing out of the area of the second stepped part. Because the peripheral face of the step portion is tapered toward one end, the welding force directly affecting the semiconductor chip via the electrode plates can be alleviated so as to safely protect the semiconductor chip.

(5) With respect to the electrode plates having the square stepped protrusions, the formation of orientation slits and/or an orientation flat for each electrode plate allows an easier implementation of positioning the sides of the stepped protrusions in parallel during the process of assembling the semiconductor element by using the orientation slits and/or orientation flat as references.

(6) The heat shrinkage tube greatly simplifies the implementation of a protective layer as compared with the conventional device. In addition, the protective layer has uniform thickness on the peripheral face of the chip.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor element including an electrode construction, comprising:
   a first electrode plate having a base and a first stepped protrusion, said first stepped protrusion being positioned in a central portion of said base of said first electrode plate, said first stepped protrusion having a smaller area than said first electrode plate and including a tapered peripheral face toward one end;
   a second electrode plate having a base and a first stepped protrusion, said first stepped protrusion being positioned in a central portion of said base of said second electrode plate, said first stepped protrusion of said second electrode plate having a smaller area than said second electrode plate; and
   a semiconductor chip having a first pair of protrusions and a second pair of protrusions, said first pair of protrusions defining a first area of solder joint and said second pair of protrusions defining a second area of solder joint, said semiconductor chip being positioned between said first and second electrode plates, each of said first and second electrode plates being joined to respective sides of said semiconductor chip with solder, each of said first stepped protrusions of said first and second electrode plates being positioned between each said pair of protrusions of said semiconductor chip, respectively.

2. A semiconductor element according to claim 1, wherein said first and second electrode plates each has a disc shape and said semiconductor chip has a square shape.

3. A semiconductor element according to claim 2, wherein each of said first and second electrode plates has a diameter greater than the diagonal dimension of the square shape of said semiconductor chip.

4. A semiconductor element according to claim 1, wherein said first stepped protrusion has a circular shape with a diameter small enough to fit in said solder joint of said semiconductor chip.

5. A semiconductor element according to claim 1, wherein said first stepped protrusion has a square shape with a diagonal dimension small enough to fit in said solder joint of said semiconductor chip.

6. A semiconductor element according to claim 1, further comprising an electrically insulating heat shrinkage tube, said heat shrinkage tube surrounding an outer periphery of an assembly, said assembly including said semiconductor element, said first stepped protrusions, and said solder.

7. A semiconductor element according to claim 6, wherein said heat shrinkage tube provides a protective layer of uniform thickness to said assembly.

8. A semiconductor element including an electrode construction, comprising:
   a first electrode plate having a base, a first stepped protrusion, and a second stepped part, said second stepped part protruding from said base and positioned between said first electrode plate and said first stepped protrusion, said second stepped part surrounding said first stepped protrusion, and said first stepped protrusion being positioned in a central portion of said second stepped part, said second stepped part of said first electrode plate having a smaller area than said first electrode plate;
   a second electrode plate having a base, a first stepped protrusion, and a second stepped part, said second stepped part protruding from said base and positioned between said second electrode plate and said first stepped protrusion, said second stepped part surrounding said first stepped protrusion, and said first stepped protrusion being positioned in a central portion of said second stepped part, said second stepped part of said second electrode plate having a smaller area than said second electrode plate; and
   a semiconductor chip having a first pair of protrusions and a second pair of protrusions, said first pair of protrusions defining a first area of solder joint and said second pair of protrusions defining a second area of solder joint, said semiconductor chip being positioned between said first and second electrode plates, each of said first and second electrode plates being joined to respective sides of said semiconductor chip with solder, each of said first stepped protrusions of said first and second electrode plates being positioned between each said pair of protrusions of said semiconductor chip, respectively, said first stepped protrusion and said second stepped part of said first and second electrode plates being smaller in size than said semiconductor chip.

9. A semiconductor element according to claim 8, wherein said first and second electrode plates each has a disc shape and said semiconductor chip has a square shape.

10. A semiconductor element according to claim 9, wherein each of said second stepped parts has a diameter smaller than the diagonal dimension of said semiconductor chip.

11. A semiconductor element according to claim 10, wherein said first stepped protrusion includes a tapered peripheral face toward one end.

12. A semiconductor element according to claim 8, wherein said second stepped part includes a notch formed on a peripheral face of said second stepped part for holding and restraining molten solder, and wherein said notch prevents solder from flowing out of said second stepped part.

13. A semiconductor element according to claim 8, wherein said second stepped part includes a dam formed on a peripheral face of said second stepped part for holding and restraining molten solder, and wherein said dam prevents solder from flowing out of said second stepped part.

14. A semiconductor element according to claim 8, wherein said first stepped protrusion includes a tapered peripheral face toward one end.

15. A semiconductor element including an electrode construction, comprising:

a first electrode plate having a base and a first stepped protrusion, said first stepped protrusion being positioned in a central portion of said base of said first electrode plate, said first stepped protrusion having a smaller area than said first electrode plate;

a second electrode plate having a base and a first stepped protrusion, said first stepped protrusion being positioned in a central portion of said base of said second electrode plate, said first stepped protrusion of said second electrode plate having a smaller area than said second electrode plate, each of said first and second electrode plates including means for positioning said first and second electrode plates; and a semiconductor chip having a first pair of protrusions and a second pair of protrusions, said first pair of protrusions defining a first area of solder joint and said second pair of protrusions defining a second area of solder joint, said semiconductor chip being positioned between said first and second electrode plates, each of said first and second electrode plates being joined to respective sides of said semiconductor chip with solder, each of said first stepped protrusions of said first and second electrode plates being positioned between each said pair of protrusions of said semiconductor chip, respectively.

16. A semiconductor element according to claim 15, further comprising an electrically insulating heat shrinkage tube, said heat shrinkage tube surrounding an outer periphery of an assembly, said assembly including said semiconductor element, said first stepped protrusions, and said solder.

17. A semiconductor element according to claim 16, wherein said heat shrinkage tube provides a protective layer of uniform thickness to said assembly.

18. A semiconductor element according to claim 15, wherein said position means is a plurality of orientation slits disposed on each of said first and second electrode plates at a side opposing said first stepped protrusion.

19. A semiconductor element according to claim 15, wherein said positioning means is an orientation flat disposed at a portion of the peripheral edge of each of said first and second electrode plates.

20. A semiconductor element including an electrode construction, comprising:

an electrode plate having a base, a first stepped protrusion and a second stepped part, said second stepped part protruding from said base, said second stepped part surrounding said first stepped protrusion, and said first stepped protrusion being positioned in a central portion of said second stepped part, said second stepped part of said electrode plate having a smaller area than said electrode plate; and a semiconductor chip having a pair of protrusions, said pair of protrusions defining an area of solder joint, said semiconductor chip being positioned adjacent to said electrode plate, said electrode plate being joined to one side of said semiconductor chip with solder, said first stepped protrusion being positioned between said pair of protrusions of said semiconductor chip, said first stepped protrusion and said second stepped part being smaller in size than said semiconductor chip.

* * * * *